United States Patent [19]
Dougherty

[11] Patent Number: 5,986,518
[45] Date of Patent: Nov. 16, 1999

[54] DISTRIBUTED MMIC ACTIVE QUADRATURE HYBRID AND METHOD FOR PROVIDING IN-PHASE AND QUADRATURE-PHASE SIGNALS

[75] Inventor: Richard Matthew Dougherty, Scottsdale, Ariz.

[73] Assignee: Motorola, Inc., Schaumburg, Ill.

[21] Appl. No.: 09/109,282

[22] Filed: Jun. 30, 1998

[51] Int. Cl.[6] .............................. H01P 5/12; H03F 3/68
[52] U.S. Cl. ...................... 333/117; 333/136; 330/286; 330/295
[58] Field of Search .................. 333/109, 112, 333/117, 136; 330/295, 286

[56] References Cited

U.S. PATENT DOCUMENTS

| | | | |
|---|---|---|---|
| 4,668,920 | 5/1987 | Jones | 330/286 |
| 4,893,098 | 1/1990 | Seely et al. | 333/112 |
| 4,914,728 | 4/1990 | Fullerton | 333/118 |
| 4,973,918 | 11/1990 | Schindler | 330/286 X |
| 5,089,791 | 2/1992 | Vasile | 330/295 |
| 5,166,640 | 11/1992 | Fathimulla et al. | 330/295 |
| 5,361,038 | 11/1994 | Allen et al. | 330/295 X |
| 5,546,421 | 8/1996 | Basile et al. | 333/117 X |
| 5,748,056 | 5/1998 | Bahl | 333/112 |

*Primary Examiner*—Robert Pascal
*Assistant Examiner*—Barbara Summons
*Attorney, Agent, or Firm*—Gregory J. Gorrie

[57] ABSTRACT

A distributed MMIC active quadrature hybrid (10) provides in-phase (I) and quadrature-phase (Q) outputs (22, 24) over an octave bandwidth. The quadrature hybrid includes in-phase and quadrature-phase amplifying elements (14, 12) arranged in a distributed manner. The in-phase amplifying elements (14) include FETs (42) with series inductive feedback (44) in the source path. The quadrature-phase amplifying elements (12) includes FETs (52) with series capacitive feedback (54) in the source path. The series inductive and capacitive feedback provides the phase difference between the hybrid's outputs. The FETs of the in-phase and quadrature-phase amplifying elements have differing gate peripheries to provide amplitude tracking over the bandwidth.

19 Claims, 1 Drawing Sheet

DISTRIBUTED MMIC ACTIVE QUADRATURE HYBRID AND METHOD FOR PROVIDING IN-PHASE AND QUADRATURE-PHASE SIGNALS

FIELD OF THE INVENTION

This invention relates in general to 90 degree hybrids and more specifically to active quadrature hybrids, and specifically broadband hybrids for monolithic microwave integrated circuits (MMIC).

BACKGROUND OF THE INVENTION

Major components in many microwave systems require quadrature hybrids to provide in-phase (I) and quadrature-phase (Q) signals. Typical MMIC quadrature hybrids are lossy and have a limited operational bandwidth. As a result of this limited bandwidth, PSK & QPSK modulators and other microwave circuitry, such as image reject mixers and digital/analog phase shifters, have a resulting limited bandwidth. Accordingly, what is needed is a quadrature hybrid with increased bandwidth. What is also needed is a broadband quadrature hybrid suitable for MMIC fabrication for reduced cost, circuit size and process variation. It is desirable for such a broad bandwidth quadrature hybrid to have less loss than typical quadrature hybrids, and preferably even have gain.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

The exemplification set out herein illustrates a preferred embodiment of the invention in one form thereof, and such exemplification is not intended to be construed as limiting in any manner.

DETAILED DESCRIPTION OF THE DRAWINGS

In the preferred embodiments of the present invention, a distributed MMIC active quadrature hybrid provides in-phase (I) and quadrature-phase (Q) outputs over several octaves of bandwidth. The quadrature hybrid includes in-phase and quadrature-phase amplifying elements arranged in a distributed manner. The in-phase amplifying elements include FETs with series inductive feedback in the source path. The quadrature-phase amplifying elements include FETs with series capacitive feedback in the source path. The series inductive and capacitive feedback provides the phase difference between the hybrid's outputs. The FETs of the in-phase and quadrature-phase amplifying elements have differing gate peripheries to provide amplitude tracking over the bandwidth.

The distributed active quadrature hybrid of the present invention is suitable for fabrication on MMIC die and in the preferred embodiments, provides in-phase and quadrature-phase outputs that are substantially amplitude matched over several octaves of bandwidth. Although the preferred embodiment of the invention has been illustrated, and that form described in detail, it will be readily apparent to those skilled in the art that various modifications may be made therein without departing from the spirit of the invention or from the scope of the appended claims.

Figure 1:
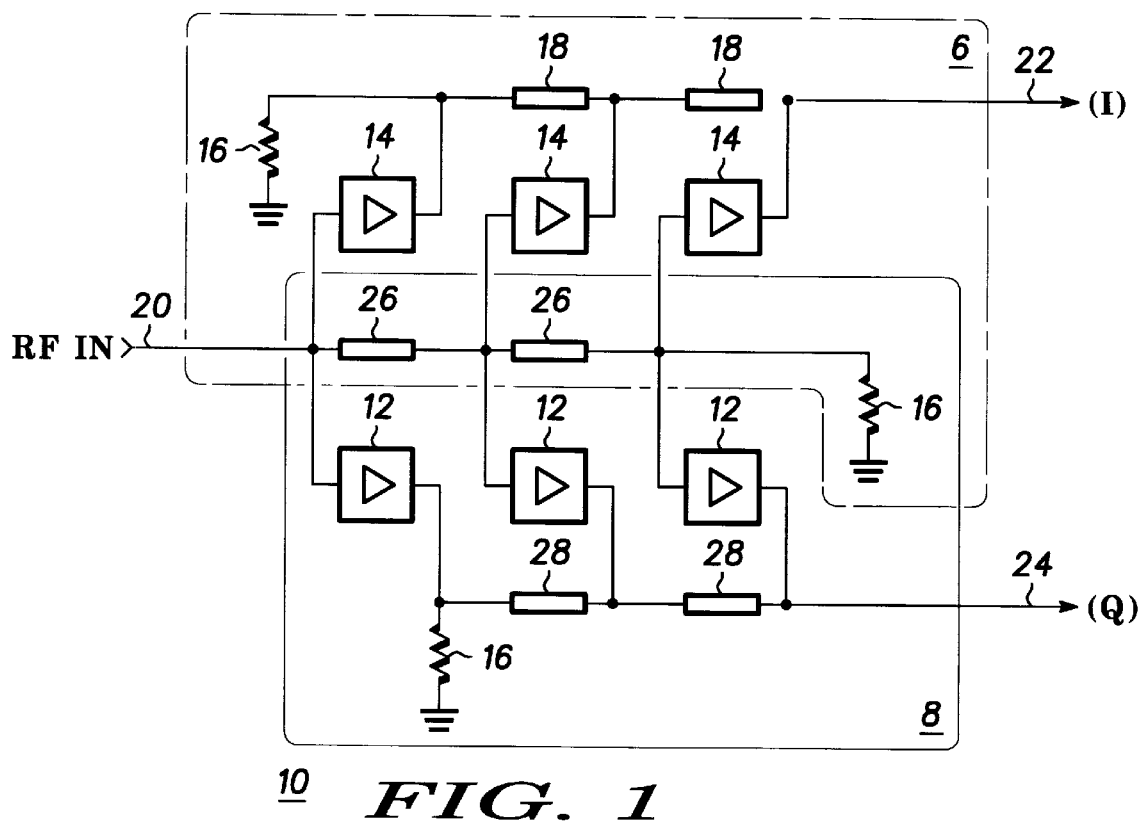
FIG. 1 is a simplified schematic diagram of the distributed active quadrature hybrid in accordance with a preferred embodiment of the present invention.

FIG. 1 is a simplified schematic diagram of the distributed active quadrature hybrid in accordance with a preferred embodiment of the present invention. Quadrature hybrid 10 includes a first group of amplifying elements 14 arranged in a distributed manner, and a second group of amplifying elements 12 also arranged in a distributed manner. Quadrature hybrid 10 may be viewed as a combination of two distributed amplifiers, distributed amplifier 6 and distributed amplifier 8, sharing a common transmission line represented by inductances 26. Inductances 18 represent a transmission line coupling with the outputs of amplifying elements 14. Inductances 28 represent a transmission line coupling the outputs of amplifying elements 12. The transmission lines preferably include terminations 16 which are chosen to provide a good match and prevent transmission line reflections. Typically, terminations 16 are a resistive element at approximately the transmission line impedance, for example, 50 Ohms. Transmission lines also include representations of other transmission line elements such as shunt capacitances (not shown), for example, the shunt capacitances contributed by MESFET devices.

The operation of distributed active quadrature hybrid 10 is described as follows. An RF input signal present at input port 20 is amplified by amplifying elements 12 and 14. The output of the amplifying elements 14 combine in-phase and produce RF output signals at in-phase output port 22. The output of the amplifying elements 12 combine in-phase and produce RF output signals at quadrature-phase output port 24. In accordance with the preferred embodiment, amplifying elements 12 provide output signals that are phase shifted approximately 90 degrees from the output signals of amplifying elements 14. Accordingly, output port 24 provides the quadrature-phase output signal while output port 22 provides the in-phase output signal.

Although quadrature hybrid 10 illustrates three in-phase amplifying elements 14 and three quadrature-phase amplifying elements 12, quadrature hybrid 10 of the present invention, may include as few as two in-phase amplifying elements 14 and two quadrature-phase amplifying elements 12, resulting in reduced gain and bandwidth. On the other hand, quadrature hybrid 10 of the present invention may include as many as six or more in-phase amplifying elements 14 and as many as ten or more quadrature-phase amplifying elements 12 for increased bandwidth and gain. Preferably, the number of in-phase and quadrature-phase amplifying elements ranges between two and five to provide both broad frequency response and maximal gain.

Figure 2:
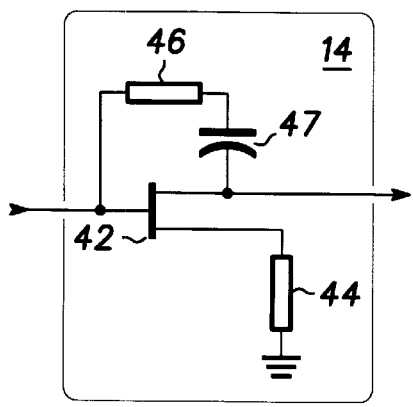
FIG. 2 illustrates a simplified schematic diagram of an in-phase amplifier element in accordance with a preferred embodiment of the present invention.

FIG. 2 illustrates a simplified schematic diagram of in-phase amplifier element 14 in accordance with a preferred embodiment of the present invention. In-phase amplifying element 14 preferably includes an active amplifying element such as field effect transistor (FET) 42 which employs series inductance 44 coupling the source node to ground. In-phase amplifying element 14 may also include resistive feedback element 46 coupling the gate and drain. In-phase amplifying element 14 may also include a capacitive element 47 in series with resistive feedback element 46. Capacitive element 47 is for DC blocking.

Figure 3:
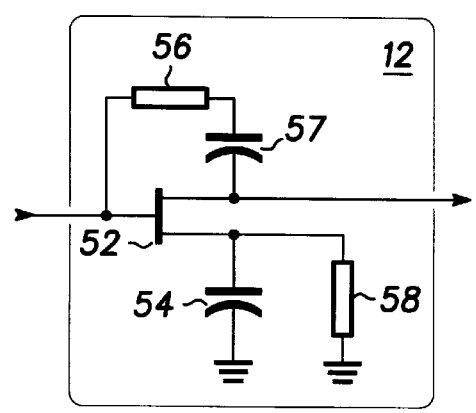
FIG. 3 illustrates a simplified schematic diagram of a quadrature-phase amplifying element in accordance with a preferred embodiment of the present invention.

FIG. 3 illustrates a simplified schematic diagram of quadrature-phase amplifying element 12 in accordance with a preferred embodiment of the present invention. Quadrature-phase amplifying element 12 includes an active amplifying element such as FET 52 and employs series capacitance 54 between the source and ground. Quadrature-phase amplifying element 12 may also include a resistive feedback element 56 coupling the gate and drain. Quadrature-phase amplifying element 12 also includes inductive choke 58 which provides DC a current return for FET 52 when a separate capacitor is used for source series capacitance 54. Inductive choke 58 desirably looks like an open circuit at RF frequencies and functions as an RF choke. Quadrature-phase amplifying element 12 may also include a capacitive element 57 in series with resistive feedback element 56. Capacitive element 57 is for DC blocking.

Source series capacitance 54 (FIG. 3) and the source series inductance 44 (FIG. 2) are selected to provide quadrature-phase difference between the outputs of amplifying elements 14 and 12, respectively. In a preferred embodiment of the present invention, source series inductance 44 desirably ranges between 0.5 nH and 3.0 nH, and is preferably between 1.0 and 2.0 nH. The desired frequency of operation will help determine the exact value for source series inductance 44. Source series capacitance 54 is desirably in the range of 0.5 pF to 7.0 pF, and depends, among other things, on the frequency of operation. In one embodiment of the present invention, the internal source capacitance of FET 52 is employed as source series capacitance 54 and source series inductance 44 is selected to provide the quadrature-phase difference between the outputs of hybrid 10.

In the preferred embodiment of quadrature hybrid 10, resistive feedback element 46 (FIG. 2) and resistive feedback element 56 (FIG. 3) are not included. Resistive feedback elements 46 and 56 may be used to provide increased amplifier stability for amplifying elements 12 and 14. When amplifying elements 12 and 14 are arranged in a distributed structure in hybrid 10 (FIG. 1), resistive feedback elements 46 and 56 are generally not necessary. In the embodiment of the present invention that includes resistive feedback elements 46 and 56, the value of each resistive feedback element is on the order of 500 Ohms, however other values may be suitable for amplifier element stability.

In accordance with the preferred embodiment of the present invention, quadrature hybrid 10, including amplifying elements 12 and 14 and the distributed transmission line structure, is fabricating on an MMIC die, preferably a Gallium Arsenide (GaAs) die. In this embodiment, each FET 42 and 52 has a predetermined gate periphery. The total gate periphery is defined as the total gate width. For example, when a FET has 5 gates and each gate has a 100 micron gate width, the total gate periphery for the FET is 500 microns. The gate length does not affect the total gate periphery. In accordance with the preferred embodiments of the present invention, the gate peripheries of FETs 42 and FETs 52 are chosen to provide substantially amplitude matched outputs at the in-phase port 22 and quadrature-phase port 24 of hybrid 10 over a predetermined bandwidth. Typically, in-phase amplifying elements 14 have more gain than quadrature-phase amplifying elements 12. Accordingly, the total gate periphery of the FETs in the in-phase path and quadrature-phase path is chosen to compensate for this gain difference. In accordance with the preferred embodiments described herein, the total gate periphery of the FETs in the in-phase path is greater than the total gate periphery of the FETs in the quadrature-phase path.

In the preferred embodiment of the present invention, when quadrature hybrid 10 is designed to have at least an octave bandwidth, and preferably several octaves of bandwidth, for example 2 to 10 GHz, the total gate periphery of each FET 42 in the in-phase path is on the order of twice the total gate periphery of FETs 52 in the quadrature-phase path. For example, when half-micron MESFETs are used on a GaAs MMIC substrate, the total gate periphery of each FET 42 in the in-phase path is on the order of 600 microns while the total gate periphery of FETs 52 in the quadrature-phase path is on the order 300 microns. Other gate peripheries are also suitable and are chosen to provide substantial amplitude matching between the in-phase and quadrature-phase outputs of quadrature hybrid 10. In this embodiment of the present invention, a phase difference between the in-phase and quadrature-phase ports of at least within 5 degrees of 90 degrees is achieved with an amplitude tracking of plus or minus 0.5 dB over the 2–10 GHz frequency bandwidth. The phase difference between the in-phase and quadrature-phase ports is desirably within 1.5 degrees of 90 degrees.

Although this embodiment of the present invention included half micron devices, other size devices, such as ¼ micron and 1 micron, etc. are also suitable. The preferred embodiment of the present invention uses MESFETs for FETs 42 and 52, although other active devices such as H-FETs, HEMPs are also suitable.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A quadrature hybrid comprising:
   a first plurality of amplifying elements arranged in a distributed structure for amplifying an RF input signal and providing an in-phase RF output signal; and
   a second plurality of amplifying elements arranged in the distributed structure for amplifying the RF input signal and providing a quadrature RF output signal,
   wherein each amplifying element of the first plurality comprises a first field effect transistor (FET) employing source series inductance, and
   wherein each amplifying element of the second plurality comprises a second field effect transistor (FET) employing source series capacitance.

2. The quadrature hybrid as claimed in claim 1 wherein the source series inductance employed by each amplifying element of the first plurality and the source series capacitance employed by each amplifying element of the second plurality are selected to provide a substantially ninety-degree phase difference between the in-phase and quadrature-phase RF output signals over a pre-selected frequency range.

3. The quadrature hybrid as claimed in claim 1 wherein the first FETs have differing gate peripheries than the second FETs, the differing gate peripheries providing reduced amplitude difference between the in-phase and quadrature-phase RF output signals, the first FETs having greater gate peripheries than the second FETS.

4. The quadrature hybrid as claimed in claim 1 wherein the source series inductance comprises a high impedance transmission line coupling a source of each first FET with a ground.

5. The quadrature hybrid as claimed in claim 1 wherein the source series inductance comprises an inductor coupling a source of each first FET with a ground.

6. The quadrature hybrid as claimed in claim 1 wherein each source series capacitance comprises a capacitor coupling a source of each second FET to ground, and wherein each amplifying element of the second plurality includes an inductive choke coupling said source of each second FET to ground.

7. The quadrature hybrid as claimed in claim 1 wherein the source series capacitance is comprised of an internal source capacitance of each second FET.

8. The quadrature hybrid as claimed in claim 1 wherein each amplifying element of the first plurality includes a first resistive feedback element coupling a drain and source of each first FET, and each amplifying element of the second plurality includes a second resistive feedback element coupling a drain and source of each second FET.

9. The quadrature hybrid as claimed in claim 1 wherein the distributed structure comprises:
   a first transmission line coupling drains of the first FETs;
   a second transmission line coupling drains of the second FETs; and
   a third transmission line coupling gates of the first and second FETs.

10. The quadrature hybrid as claimed in claim 9 wherein the first and second plurality of amplifying elements and the first, second and third transmission lines are fabricated on a GaAs MMIC die.

11. The quadrature hybrid as claimed in claim 1 wherein the first and second FETs comprise half-micron MESFETs.

12. The quadrature hybrid as claimed in claim 1 wherein the first and second FETs comprise of high-electron mobility field effect transistors (H-FETs).

13. The quadrature hybrid as claimed in claim 1 wherein the quadrature-phase RF output signal is shifted substantially ninety-degrees in-phase from said in-phase RF output signal.

14. The quadrature hybrid as claimed in claim 1 wherein the quadrature-phase RF output signal has a phase component within five degrees of ninety-degrees from said in-phase RF output signal over at least an octave frequency range of input RF signals, and wherein the in-phase and quadrature-phase RF output signals track within 0.5 dB over said octave frequency range, and wherein the in-phase and quadrature-phase RF output signals are greater in amplitude than said RF input signal over said octave frequency range.

15. The quadrature hybrid as claimed in claim 14 wherein the octave frequency range includes substantially a frequency range of two to ten GHz.

16. A method of providing in-phase and quadrature-phase signals comprising the steps of:

amplifying an input signal with a first plurality of amplifying elements arranged in a distributed structure to provide the in-phase signal;

amplifying the input signal with a second plurality of amplifying elements arranged in the distributed structure to provide the quadrature-phase signal;

providing source series inductance in each amplifying element of the first plurality; and providing source series capacitance in each amplifying element of the second plurality.

17. The method as claimed in claim 16 wherein the first and second plurality of amplifying elements are comprised respectively of first and second FETS, each FET having a gate periphery, and the method further comprises the step of providing the first FETs having a differing gate periphery than the second FETS, the differing gate peripheries being provided for reduced amplitude difference between the in-phase and quadrature-phase signals, the gate periphery of the first FETs being greater than the gate periphery of the second FETs.

18. A method as claimed in claim 17 wherein the providing source series inductance step includes the step of providing the source series inductance and the providing source series capacitance step includes the step of providing source series capacitance, the source series inductance and capacitance causing substantially a ninety-degree phase difference between the in-phase and quadrature-phase RF output signals over a pre-selected frequency range.

19. An MMIC active quadrature hybrid comprising:
   a first plurality of amplifying elements arranged in a distributed manner for amplifying an RF input signal and providing an in-phase RF output signal, each amplifying element of the first plurality including a first field effect transistor (FET) with a source series inductance;
   a second plurality of amplifying elements arranged in the distributed manner for amplifying the RF input signal and providing a quadrature-phase RF output signal, each amplifying element of the second plurality including a second field effect transistor (FET) with a source series capacitance;
   a first transmission line coupling drains of the first FETs;
   a second transmission line coupling drains of the second FETS; and
   a third transmission line coupling gates of the first and second FETs,
   wherein each first and second FET has a gate periphery associated therewith, the first FETs having differing gate peripheries than the second FETs, the differing gate peripheries providing reduced amplitude difference between the in-phase and quadrature-phase RF output signals, and
   wherein the first and second plurality of amplifying elements and the first, second and third transmission lines are provided on a GaAs MMIC die.

* * * * *